United States Patent
Shubin et al.

(10) Patent No.: US 10,340,407 B2
(45) Date of Patent: Jul. 2, 2019

(54) AVALANCHE PHOTODETECTOR

(71) Applicant: LLC "DEPHAN", Skolkovo (RU)

(72) Inventors: Vitaly Emmanuilovich Shubin, Moscow (RU); Dmitry Alexeevich Shushakov, Moscow (RU); Nikolay Afanasievich Kolobov, Moscow (RU)

(73) Assignee: LLC "Dephan", Skolkovo (RU)

( * ) Notice: Subject to any disclaimer, the term of this patent is extended or adjusted under 35 U.S.C. 154(b) by 0 days.

(21) Appl. No.: 15/571,822

(22) PCT Filed: Oct. 18, 2016

(86) PCT No.: PCT/RU2016/000708
§ 371 (c)(1),
(2) Date: Nov. 4, 2017

(87) PCT Pub. No.: WO2018/056861
PCT Pub. Date: Mar. 29, 2018

(65) Prior Publication Data
US 2018/0351023 A1    Dec. 6, 2018

(30) Foreign Application Priority Data
Sep. 20, 2016   (RU) ................................. 2016137501

(51) Int. Cl.
*H01L 31/107* (2006.01)
*H01L 31/18* (2006.01)

(52) U.S. Cl.
CPC ........ *H01L 31/107* (2013.01); *H01L 31/1804* (2013.01)

(58) Field of Classification Search
CPC .......................... H01L 31/107; H01L 31/1804
See application file for complete search history.

(56) References Cited

U.S. PATENT DOCUMENTS

| | | | | |
|---|---|---|---|---|
| 5,689,122 | A * | 11/1997 | Chandrasekhar ... | H01L 27/1443 257/184 |
| 6,005,266 | A * | 12/1999 | Forrest .................. | H01L 29/808 257/256 |
| 8,039,918 | B2 * | 10/2011 | Nakata ................ | H01L 31/1075 257/466 |
| 2009/0008738 | A1 * | 1/2009 | Yuan ...................... | B82Y 20/00 257/438 |

* cited by examiner

*Primary Examiner* — Fernando L Toledo
*Assistant Examiner* — Neil R Prasad
(74) *Attorney, Agent, or Firm* — Bardmesser Law Group

(57) ABSTRACT

An avalanche photodetector (APD) includes a photo converter for signals to be demodulated into free charge carriers; and at least one avalanche amplifier for the free charge carriers. The photo converter and the avalanche amplifier are located next to each other on the same substrate and are in direct contact with each other. The avalanche amplifier includes a contact layer and a multiplier layer. The multiplier layer is made of a semiconductor of the same conductivity type as the photo converter and faces the substrate abutting the photo converter on one side. A first electrode is on the contact layer of the avalanche amplifier, while the second electrode is on a bottom of the substrate.

69 Claims, 4 Drawing Sheets

AVALANCHE PHOTODETECTOR

CROSS REFERENCE TO RELATED APPLICATIONS

This application is a US National Phase of PCT/RU2016/000708, filed on Oct. 18, 2016, which claims priority to RU 2016137501, filed on Sep. 20, 2016, both of which are incorporated by reference herein in their entirety.

BACKGROUND OF THE INVENTION

Field of the Invention

The present invention relates to photodetectors, and more particularly, to avalanche photodetectors (APDs), that receive and detect relatively weak light signals. Such APDs are widely used in communication systems, environmental monitoring systems, as well as in medicine, biology, robotics, etc.

Description of the Related Art

Conventional avalanche-type PDs comprise a semiconductor substrate covered with several layers of various semiconductor materials, a group of which forms a photo converter that absorbs signal photons, which then produce free charge carriers, such as electrons or holes. Further, these charge carriers produced by the light pass into another group of layers forming an avalanche amplifier that generates an area of an electric field with enough intensity for avalanche multiplication of the carriers.

Thus, an APD comprises a photo converter that converts signal photons into electrons, and an avalanche amplifier that amplifies the photo-current so that it can be registered by standard semiconductor amplifiers.

Threshold sensitivity is one of the primary parameters for APDs; threshold sensitivity is defined by the characteristics of both the photo converter and the avalanche amplifier. For instance, threshold sensitivity may be significantly limited by background current, or noise current, of the avalanche amplifier largely caused by the intense field necessary for avalanche multiplication of photo carriers.

In order to reduce the background current of the avalanche amplifier and, therefore, improve threshold sensitivity of the APD, the area of the avalanche amplifier is made smaller when compared with that of the photo converter.

This approach has been implemented in an APD embodiment of AU2014201708 (A1) and U.S. Pat. No. 9,035,410, where the avalanche amplifier is located near the photo converter on the same substrate, wherein the photo converter has a larger area than the avalanche amplifier.

In this publication, the electrical connection between the photo converter and the avalanche amplifier is made with a conductive jumper, i.e., the connection is external in relation to the photo converter and the avalanche amplifier, the main semiconductor components of the device.

The conventional art has some shortcomings. The way of transmitting photo carriers from the photo converter to the avalanche amplifier via an external circuit, and not within the single semiconductor structure, is prone to excess noise (noise current), which significantly diminishes the device's sensitivity to weak signals, i.e., its threshold sensitivity.

Accordingly, it is desired to provide an APD with high threshold sensitivity, which would not be limited by excess noise or background current affecting the process of photo carrier transmission from the photo converter to the avalanche amplifier.

SUMMARY OF THE INVENTION

Accordingly, the present invention is related to an avalanche photodetector (APD) that substantially obviates one or more of the disadvantages of the related art.

In one embodiment, an APD includes a photo converter for signals to be demodulated into free charge carriers and at least one avalanche amplifier for these carriers, both located next to each other on the same substrate, wherein the amplifier has two layers: a contact layer and a multiplier layer. The multiplier layer is made of a semiconductor of the same conduction type as the photo converter and faces the substrate abutting the converter. The first electrode is placed on the contact layer of the avalanche amplifier, while the second electrode is placed on the conductive substrate.

The multiplier layer of the avalanche amplifier may be made of the same semiconductor as the photo converter. The avalanche amplifier may be a P/N junction formed by a multiplier layer and a contact layer.

A collector layer can be placed on the upper surface of the photo converter, with a gap between it and the multiplier layer, wherein the collector layer may be made of a semiconductor of the same conduction type as the photo converter, whereas the doping density of the semiconductor, that the collector layer is made of, should be higher than that of the photo converter.

Either both the collector layer and the photo converter, or both the collector layer, the photo converter and the avalanche amplifier may be all made of the same semiconductor.

The surface of the avalanche amplifier's contact layer facing the first electrode may be a continuation of the upper surface of the collector layer. Both the multiplier layer and the contact layer of the avalanche amplifier may, reasonably, be formed as a mesa structure.

The APD may also contain a dielectric layer located on the upper surface of the collector layer and photo converter, abutting the lateral surface of the avalanche amplifier, wherein the upper surface of the dielectric layer is a continuation of the upper surface of the avalanche amplifier's contact layer, whereas the first electrode may be placed on the upper surface of the avalanche amplifier's contact layer and the dielectric layer, while also this first electrode may be transparent.

The avalanche amplifier may be placed below the upper surface of the photo converter, wherein there should be a gap between the converter and the avalanche amplifier's contact layer and first electrode. In this case, the gap between the amplifier and converter may be filled with a dielectric material that would cover the surfaces of the photo converter and the collector layer, whereas an additional transparent electrode may be placed on the upper surfaces of the first electrode and the dielectric material.

The APD may also be equipped with a layer of a high-resistance material placed between the avalanche amplifier's contact layer and the first electrode.

If multiple avalanche amplifiers are used, each of their first electrodes may, reasonably, be electrically connected to each other.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED FIGURES

The accompanying drawings, which are included to provide a further understanding of the invention and are incorporated in and constitute a part of this specification, illustrate embodiments of the invention and together with the description serve to explain the principles of the invention.

In the drawings:

FIG. 1 is a cross-section of an embodiment of the APD of the present invention comprising a photo converter for signals to be demodulated into free charge carriers and an avalanche amplifier for these carriers, both located next to each other on the same substrate, wherein the amplifier consists of a contact layer and a multiplier layer facing the substrate and abutting the converter; and two electrodes placed accordingly on the contact layer of the amplifier and on the substrate.

FIG. 2 is a cross-section of another embodiment of the APD of the present invention comprising a photo converter for signals to be demodulated into free charge carriers and an avalanche amplifier for these carriers, both located next to each other on the same substrate, wherein the amplifier consists of a contact layer, a multiplier layer facing the substrate, and a buffer layer placed between the multiplication layer and the substrate abutting the converter; and two electrodes placed accordingly on the contact layer of the amplifier and on the substrate.

Figure 6:
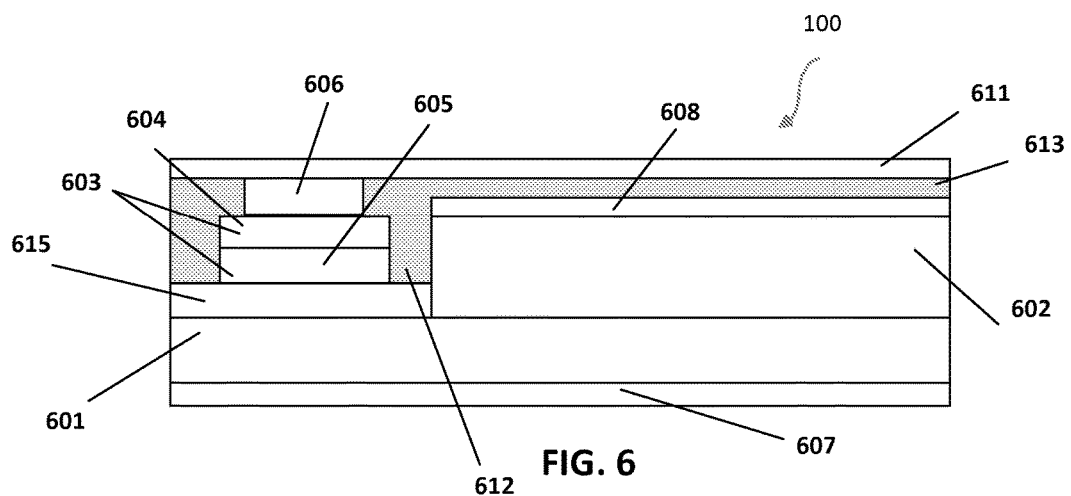

FIG. 6 is a cross-section of a sixth embodiment of the APD of the present invention, wherein the avalanche amplifier is located below the upper surface of the photo converter, a gap between the amplifier and the photo converter is filled with a dielectric material that also covers the photo converter and collector layer surfaces, and also an additional transparent electrode is placed on the upper surfaces of the first electrode and the dielectric material.

Figure 7:
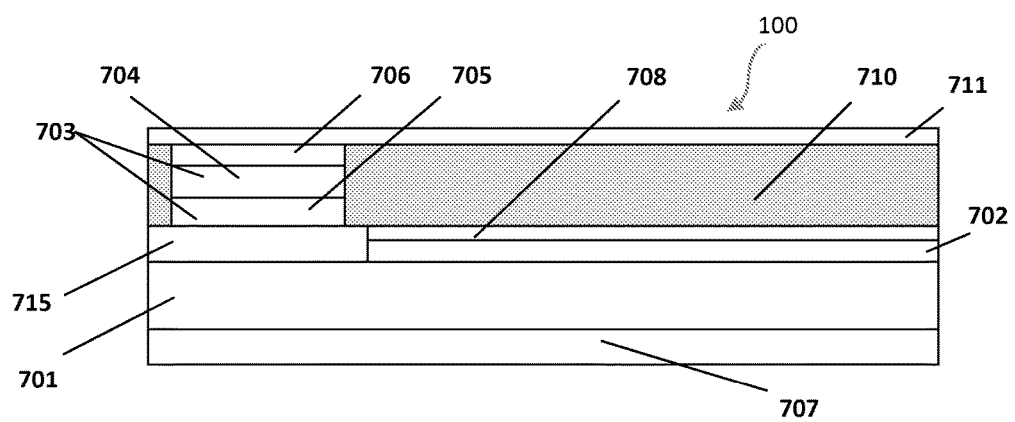

FIG. 7 is a cross-section of a seventh embodiment of the APD of the present invention, wherein the avalanche amplifier is located above the upper surface of the photo converter, with a dielectric layer located on the upper surfaces of the collector layer and photo converter layer abutting the lateral surface of the amplifier; and also a transparent electrode is placed on the upper surfaces of the amplifier's contact layer and dielectric layer.

Figure 8:
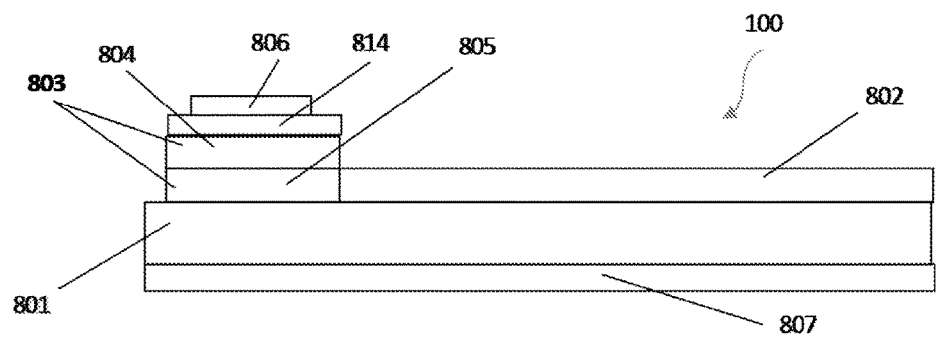

FIG. 8 is a cross-section of an eighth embodiment of the APD of the present invention, wherein a high-resistance material layer is located between the contact layer of the avalanche amplifier and the first electrode.

DETAILED DESCRIPTION OF EMBODIMENTS OF THE INVENTION

Reference will now be made in detail to the embodiments of the present invention, examples of which are illustrated in the accompanying drawings.

The figures bear the following reference numbers:
xx1—Substrate
xx2—Photo converter
xx3—Avalanche amplifier
xx4—Contact layer
xx5—Multiplier layer
xx6—First electrode
xx7—Second electrode
xx8—Collector layer
xx9—Gap between collector and multiplier layers
x10—Dielectric layer
x11—Transparent electrode
x12—Insulating gap
x13—Dielectric material
x14—High-resistance material layer
x15—Buffer layer
x16—Hidden channel under the collector layer 8
100—Light registered In the text and figures, these components have the following designations: e.g., 306, where 3 is the figure number, and 06 is the component number from the list above.

Figure 1:
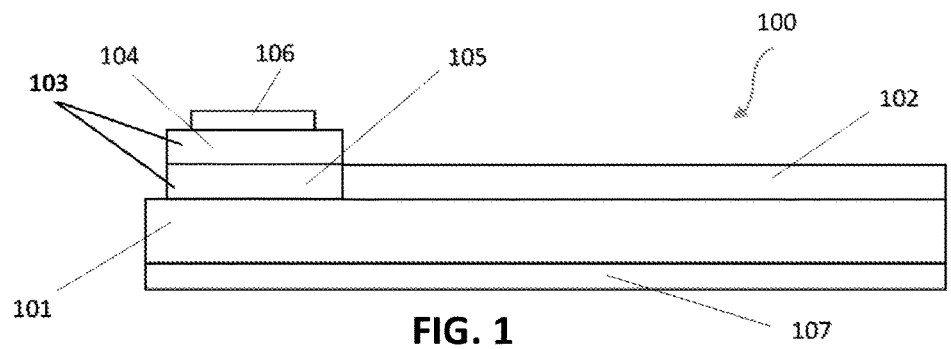

FIG. 1 shows a diagram of a cross-section of the claimed APD embodiment comprising a photo converter 102 for signals to be demodulated into free charge carriers and an avalanche amplifier 103 for these carriers, both located next to each other on the same conductive substrate 101, wherein the amplifier includes a contact layer 104 and a multiplier layer 105 facing the substrate 101 and abutting the converter 102; and two electrodes 106 and 107 placed accordingly on the contact layer 104 of the amplifier and on the substrate 101.

An example of such APD is a device comprising a p+-type silicon substrate 101 with doping density of more than $10^{18}$ cm$^{-3}$, a photo converter 102 made of p-type silicon with doping density of $10^{13}$-$10^{15}$ cm$^{-3}$ by means of epitaxy, and an avalanche amplifier 103 which has two layers: a 5-7 µm-thick multiplier layer 105 made of p-type silicon with doping density of $10^{14}$-$10^{17}$ cm$^{-3}$ by means of epitaxy and a contact layer 104 produced by means of 0.5-1.0 µm-deep diffusion of n-type dopant with a density of more than $10^{18}$ cm$^{-3}$. Two electrodes, which are, e.g., 0.5-1.0 µm aluminum, aluminum-silicon or two or more layers of Mo, Ti, Au, Al films with thickness from 0.05 to 1.0 µm, are used to connect the APD to an external circuit: the electrode 107 is placed on the substrate, the electrode 106 is placed on the contact layer of the avalanche amplifier.

The choice of material for photodetector is determined by the desired wavelength of light that is being registered. For infrared radiation in the range of 1-5 µm, preferred materials of photo converter are semiconductors $A_3B_5$ group, for example, InGaAsP, InAlAs or other narrow band versions. For the avalanche amplifier 103, InP, InAs, or other materials with a wider band than for photo converter semiconductor, which is technologically compatible with the photo converter material and have the lattice constant close to it, is preferred. An example of a compatible pair of materials for photo converter and avalanche amplifier is InP for amplifier and InGaAsP for photo converter. For the visible wavelength Silicon can be used. For wavelengths of less than 0.4 μm, wide band gap materials are preferred, for example, SiC. In this case, as for Silicon, an avalanche amplifier can be made of the same material as the photo converter.

When positive voltage is applied to the electrode 106 relative to the electrode 107, and it is high enough to trigger impact ionization in the avalanche amplifier's multiplier layer 105, then the multiplication of free charge carriers begins there, whereas the electric field passes through from the avalanche amplifier 103 to the abutting converter 102.

Signal light 100 reaching the photo converter's surface 102 is absorbed by this layer producing free charge carriers-electrons and holes-there. Free electrons produced by the light absorbed by the photo converter 102 (i.e., photoelectrons) are then captured by the field passing through from the avalanche amplifier 103 and drift towards the avalanche multiplier layer 105 to be multiplied there generating the APD output signal, while holes pass into the substrate 101. Photoelectrons produced by the light in the non-depleted region of the photo converter 102 are collected into the depleted region of the photo converter due to diffusion caused by the free electron concentration gradient in the photo converter.

As a rule, the photo converter is less than 10 μm wide, since wider converters suffer performance losses due to longer diffusion collection of photo carriers, as well as higher recombination losses.

Figure 2:
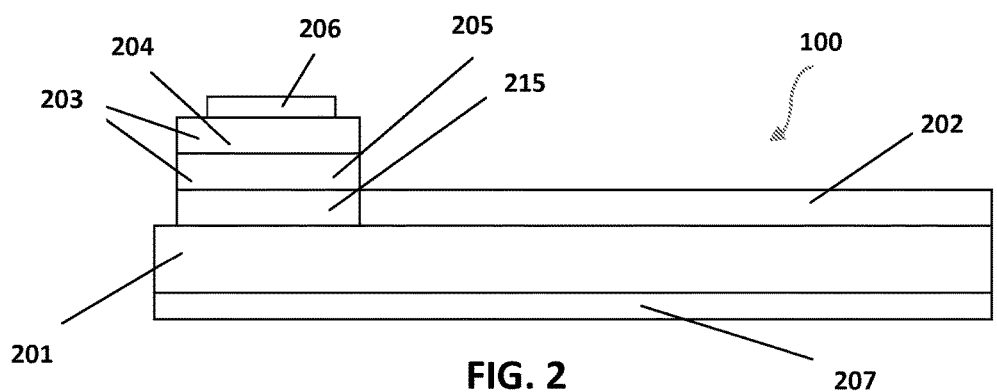

FIG. 2 shows a diagram of a cross-section of the claimed APD embodiment comprising a photo converter 202 for signals to be demodulated into free charge carriers and an avalanche amplifier 203 for these carriers, both located next to each other on the same conductive substrate 201, wherein the amplifier includes a contact layer 204, a multiplier layer 205 facing the substrate 201, and a buffer layer 215 placed between the multiplier layer 205 and the substrate 201 abutting the converter 202; and two electrodes 206 and 207 placed accordingly on the contact layer 204 of the amplifier and on the substrate 201.

An example of such APD is a device comprising a p+-type silicon substrate 201 with doping density of more than $10^{18}$ cm$^{-3}$, a photo converter 202 made of p-type silicon with doping density of $10^{13}$-$10^{15}$ cm$^{-3}$ by means of epitaxy, and an avalanche amplifier 203 which includes two layers: a 5-7 μm-thick multiplier layer 205 made of p-type silicon with doping density of $10^{14}$-$10^{17}$ cm$^{-3}$ by means of epitaxy and a contact layer 204 produced by means of 0.5-1.0 μm-deep diffusion of n-type dopant with density of more than $10^{18}$ cm$^{-3}$. A 5-7 μm-thick buffer layer 215 is made of p-type silicon with doping density of $10^{14}$-$10^{16}$ cm$^{-3}$ by means of epitaxy. Two electrodes, which are aluminum films, are used to connect the APD to an external circuit: the electrode 207 is placed on the substrate, the electrode 206 is placed on the contact layer of the avalanche amplifier.

If the avalanche amplifier is made not of silicon but of another semiconductor material, such as InP, the buffer layer is usually made of the same material as the avalanche layer, but with the opposite conductivity type.

When positive voltage is applied to the electrode 206 relative to the electrode 207, it is then applied to the avalanche amplifier 203 and the buffer layer 215 below it, which are serially connected, inducing an electric field there. If the layers are implemented according to the exemplary parameters, then the intensity of this field will be enough to trigger avalanche multiplication of free charge carriers in the multiplier layer 205 and to deplete the buffer layer 215 completely. Meanwhile, the electric field is passing through from the buffer layer 215 to the photo converter 202 located by its side thus creating a depleted region there.

Signal light 100 reaching the photo converter 202 is absorbed producing free charge carriers—electrons and holes—there. Free electrons produced by the light in the depleted area of the photo converter 202 (i.e., photoelectrons) are then captured by the field and drift towards the buffer layer 215 and onwards to the avalanche multiplier layer 205 to be multiplied there generating the APD output signal, while holes pass into the substrate 201. Photoelectrons produced by the light outside the depleted region of the photo converter 202 are collected into the depleted region of the photo converter due to diffusion.

Figure 3A:
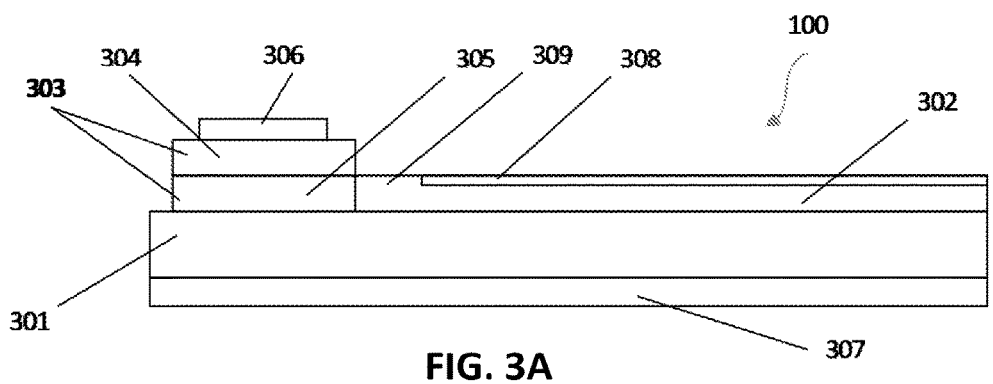
FIG. 3A is a cross-section of a third embodiment of the APD of the present invention, wherein the collector layer is located on the upper surface of the photo converter, so that there is a gap between the collector layer and the multiplier layer.

FIG. 3A shows a diagram of a cross-section of the third embodiment of the claimed APD, wherein the collector layer 308 is located on the upper surface of the photo converter 302, so that there is a gap 309 between the collector layer 308 and the multiplier layer 305 of the avalanche amplifier 303.

The collector layer 308 is used to suppress surface oscillation of minority carriers close to the surface of the photo converter 302, as well as to stabilize surface potential, and also to increase the efficiency of collection of photo carriers, which are produced by the light in the photo converter 302, in the avalanche amplifier 303.

An example of an APD with a collector layer is a device comprising a p+-type silicon substrate 301 with doping density of more than $10^{18}$ cm$^{-3}$, on which a photo converter 302 is located that is made of p-type silicon with doping density of $10^{13}$-$10^{15}$ cm$^{-3}$ by means of epitaxy. The collector layer 308 may be made by means of 0.2-0.5 μm-deep ionic doping of the silicon photo converter 302 using a dopant of the same conduction type—such as B, Al, In or Ga—with surface concentration of $10^{17}$-$10^{19}$ cm$^{-3}$. There is a 0.4-0.7 μm-wide gap 309 between the collector layer 308 and the multiplier layer 305 of the avalanche amplifier 303, wherein the amplifier includes two layers: a 5-7 μm-thick multiplier layer 305 made of p-type silicon with doping density of $10^{14}$-$10^{17}$ cm$^{-3}$ by means of epitaxy and a contact layer 304 produced by means of 0.5-1.0 μm-deep diffusion of n-type dopant with density of more than $10^{18}$ cm$^{-3}$. Two electrodes, which are for example aluminum films, are used to connect the APD to an external circuit: the electrode 307 is placed on the substrate, the electrode 306 is placed on the contact layer of the avalanche amplifier.

When a voltage is applied to the APD electrodes, photoelectrons captured by the converter's 302 electric field are multiplied in the avalanche amplifier 303 (similar to that for FIG. 1). The difference from FIG. 1 is that there is a collector layer located on the surface of the photo container, and this layer increases the efficiency of collection of photo carriers, which pass from the photo converter 302, in the avalanche amplifier 303.

Figure 3B:
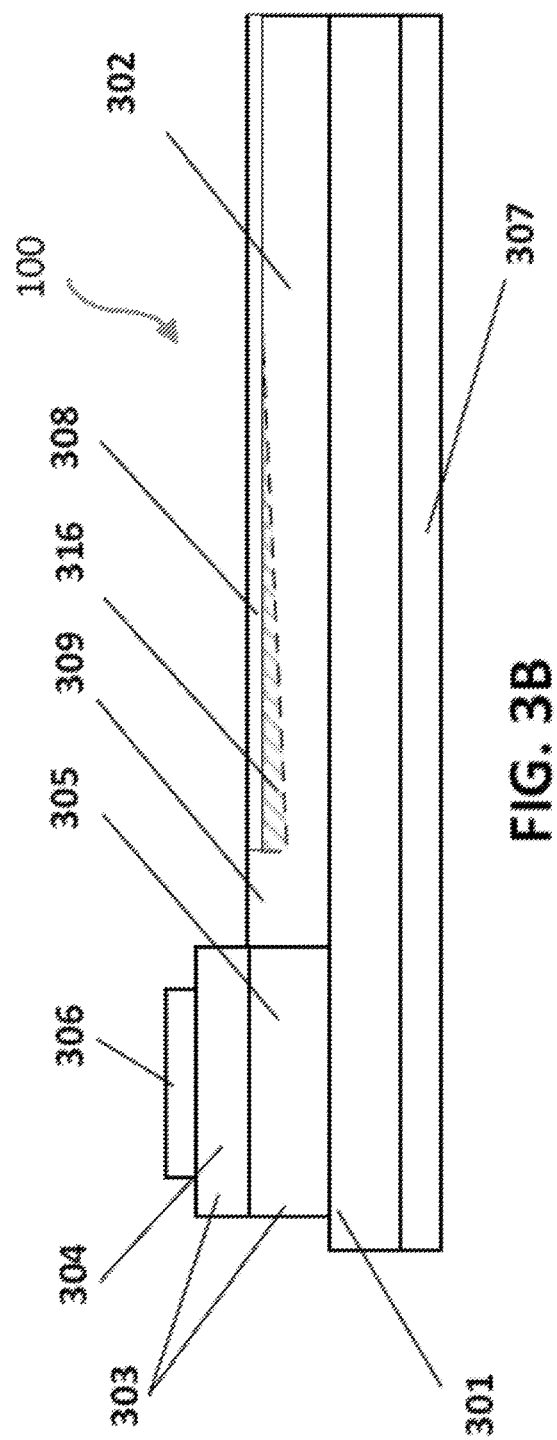
FIG. 3B is a cross-section of a third embodiment of the APD of the present invention with drawn hidden channel.

A vertical dopant concentration gradient in the photo converter 302 produced by the collector layer 308 makes it so that the electric field passing through from the avalanche amplifier 303 causes a potential electron well (hidden channel) to be formed in the depleted region of the converter located under the collector layer 308. The hidden channel 316 is shown in FIG. 3B. Photoelectrons produced by the light in the photo converter are collected in the electron well, where there is a sweeping field directed along the channel towards the avalanche amplifier, which increases the efficiency of collection of photoelectrons and the velocity of their drift from the converter to the amplifier.

An APD with the collector layer 308 is also functionally characterized in that electron and hole counter-currents in the converter are separated, which leads to less recombination of photo carriers. Holes produced during avalanche multiplication drift along the converter's surface—the collector layer—while electrons drift mainly through the hidden channel 316 under this layer (see FIG. 3B).

The gap 309 is a 0.5-1.0 μm-wide margin between the collector layer and the converter's edge next to the avalanche amplifier 303, wherein its minimum width is determined by increased spurious oscillation of charge carriers on the collector layer's edge next to the avalanche amplifier, while its maximum width is determined by the fact that, if the gap is too wide, the collector layer 308 efficiency falls, as photoelectrons leaving the hidden channel are pressed by the field to the upper surface of the photo converter and thus get into the avalanche layer outside the region, where multiplication is most efficient. If the gap width is optimal, then photoelectrons are injected into the avalanche amplifier at the hidden channel depth, determined by the collector layer thickness and doping, and thus get into the region, where multiplication is most efficient.

Figure 4:
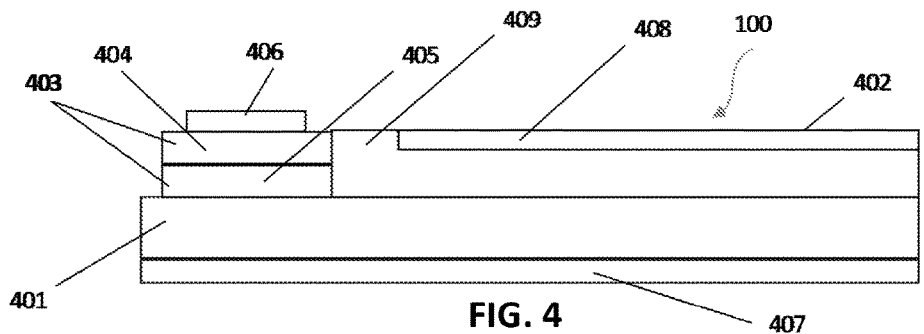
FIG. 4 is a cross-section of a fourth embodiment of the APD of the present invention, wherein the contact layer of the avalanche amplifier facing an electrode is a continuation of the upper surface of the collector layer.

As shown in FIG. 4, an embodiment of APD has the contact layer of the avalanche amplifier 404 facing the electrode 406 is a continuation of the upper surface of the collector layer 408. Such planar structure makes the APD easier to manufacture and is a preferred embodiment for APD manufacturing and packaging.

An example of an APD, as shown in FIG. 4, is a device comprising a p+-type silicon substrate 401 with doping density of more than $10^{18}$ cm$^{-3}$, on which a photo converter 402 is located that is made of p-type silicon with doping density of $10^{13}$-$10^{15}$ cm$^{-3}$ by means of epitaxy. The collector layer 408 may be made by means of 0.1-1.0 μm-deep ionic doping of the silicon photo converter 402 using a dopant of the same conduction type with surface concentration of $10^{17}$-$10^{19}$ cm$^{-3}$. The upper surface of the multiplier layer 405 of the avalanche amplifier 403 is located at the same level as the collector layer 408. There is a gap 409 similar to the gap 309 between the collector layer 408 and the multiplier layer 405 of the avalanche amplifier 403, wherein the amplifier includes two layers: a 2-7 μm-thick multiplier layer 405 made of p-type silicon with doping density of $10^{15}$-$10^{17}$ cm$^{-3}$ by means of epitaxy, and a contact layer 404 produced by means of 0.2-1.0 μm-deep diffusion of n-type dopant with density of more than $10^{18}$ cm$^{-3}$. Two electrodes, which are aluminum films, are used to connect the APD to an external circuit: the electrode 407 is placed on the substrate, the electrode 406 is placed on the contact layer of the avalanche amplifier. Both of them are, for example, aluminum films.

When positive voltage is applied to the electrode 406 relative to the electrode 407, and the voltage is high enough to trigger impact ionization in the avalanche amplifier's multiplier layer 405, then the multiplication of free charge carriers begins there. Meanwhile, the field passes through from the depleted region of the photo carrier, the region located under the avalanche amplifier 403, to the region in the photo converter layer 402 forming a hidden channel for photoelectrons under the collector layer 408. Photoelectrons produced by the light signal 100 in the open region of the photo converter are collected in the hidden channel and drift along it to the multiplier layer 405 drawn by the sweeping field.

The collector layer 408 may be thicker than the amplifier's contact layer 404, then photoelectrons will get into the avalanche multiplier layer 405 directly from the hidden channel under the collector layer 408.

In case the hidden channel depth is less than the contact layer 404 thickness, photo carriers leaving the channel may also be multiplied in the field propagating horizontally from the contact layer 404 edge in the gap area 409.

Figure 5:
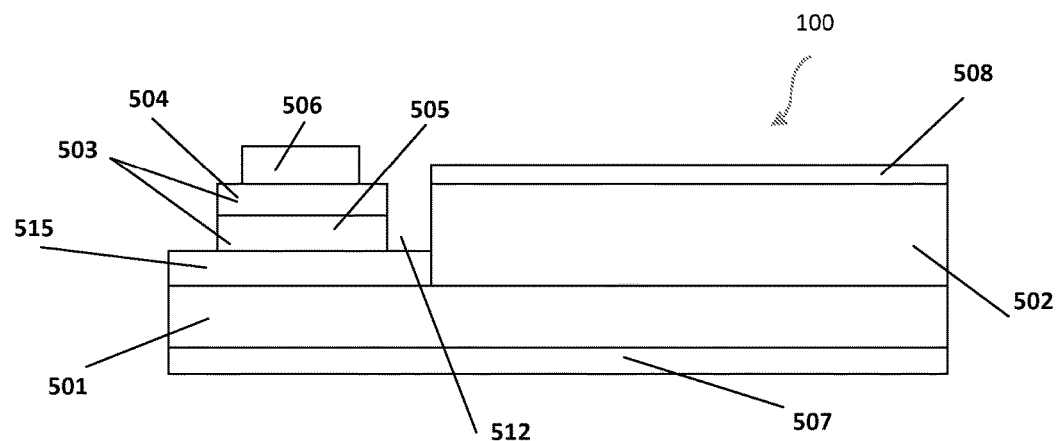
FIG. 5 is a cross-section of a fifth embodiment of the APD of the present invention, wherein the avalanche amplifier is located below the upper surface of the photo converter.

FIG. 5 is a cross-section of an embodiment of the APD of the present invention, wherein the avalanche amplifier is located below the upper surface of the photo converter. FIG. 6 is a cross-section of an embodiment of the APD of the present invention, wherein the avalanche amplifier is located below the upper surface of the photo converter, the gap between the amplifier and the photo converter is filled with a dielectric material, that also covers the photo converter and collector layer surfaces, and also an additional transparent electrodes placed on the upper surfaces of the first electrode and the dielectric materials.

As shown in FIG. 5 and FIG. 6, embodiments of APD have avalanche amplifiers 503 and 603 accordingly, both separated from collector layer 508 and 608 and photo converters 502 and 602 on one side by insulating gaps 512 and 612. Accordingly, buffer layers 515 and 615 are placed between avalanche amplifiers 503 and 603 and substrates 501 and 601. The APD shown in FIG. 6 differs in that the insulating gap 612 is filled by the 613, so that the surface of the dielectric material 613 matches the upper surface of the first electrode 606. On the upper surfaces of the first electrode 606 and dielectric material 613, there is a transparent electrode 611, which makes it possible to create a matrix of avalanche amplifiers 603 on the substrate 601.

An example of an APD, as shown in FIG. 5, is a device comprising a p-type silicon substrate 501 with doping density of more than $10^{18}$ cm$^{-3}$, on which a photo converter 502 is located that is made of p+-type silicon with doping density of $10^{13}$-$10^{15}$ cm$^{-3}$ by means of epitaxy. The collector layer 508 may be made by means of 0.1-1.0 μm-deep ionic doping of the silicon photo converter 502 using a dopant of the same conduction type with surface concentration of $10^{17}$-$10^{19}$ cm$^{-3}$. The amplifier 503 is isolated from the collector layer 508 the photo converter 502 on one side by a 0.2-1.0 μm-wide insulating gap 512. The preferred gap width value is about 0.8 μm (plus-minus 0.1 μm).

The amplifier includes two layers: a 0.2-5 μm-thick multiplier layer 505 made of p-type silicon with doping density of $10^{15}$-$10^{17}$ cm$^{-3}$ by means of epitaxy, a contact layer 504 produced by means of 0.2-1.0 μm-deep diffusion of n-type dopant with density of more than $10^{18}$ cm$^{-3}$. A 5-7 μm-thick buffer layer 515 is made of p-type silicon with doping density of $10^{14}$-$10^{16}$ cm$^{-3}$ by means of epitaxy. Two electrodes, which are 0.5-1.0 μm aluminum, aluminum-silicon or two or more layers Mo, Ni, Ti, Ta, Au, Al films with thickness from 0.05 to 1.0 μm, and which are used to connect the APD to an external circuit: the electrode 507 is placed on the substrate, the electrode 506 is placed on the contact layer of the avalanche amplifier.

The insulating gap 512 may be made of silicon by means of anisotropic etch (and, possibly, by means of isotropic etch in order to round out its lower edges). The edge rounding radius should be more than 0.2 μm in order to suppress spurious oscillation of free charge carriers in silicon in the intense field region.

When a positive voltage is applied to the electrode 506 relative to the electrode 507, it is then applied to the avalanche amplifier 503 and the buffer layer 515 below it, which are serially connected, inducing an electric field there. If the layers are implemented according to the exemplary parameters, then the intensity of this field will be enough to trigger avalanche multiplication of free charge carriers in the multiplier layer 505 and to deplete the buffer layer 515 completely. Meanwhile, the electric field is passing through from the buffer layer 515 to the photo converter 502 located by its side thus creating a depleted region there, while also forming a hidden channel under the collector layer 508 for photoelectrons (see FIG. 3A).

Signal light 100 reaching the photo converter 502 is absorbed producing free charge carriers—electrons and holes—there. Photoelectrons produced by the light in the photo converter 502 are collected in the hidden channel and drift along it towards the avalanche amplifier 503. After leaving the hidden channel, photoelectrons are captured by the sweeping field passing through from the buffer layer 515, drift there, pass through it and get into the avalanche multiplier layer 505 to be multiplied there generating the APD output signal, while holes pass into the substrate 501.

Note that the gap 512 cannot be a potential barrier for drifting photoelectrons leaving the hidden channel due to a potential gradient along the converter-gap interference directed towards the buffer layer 515.

Photoelectrons produced by the light in the lower part of the photo converter 502 may be directly captured by the sweeping field passing though from the buffer layer 515. Photoelectrons produced by the light outside the depleted region of the photo converter 502 are collected into the depleted region of the photo converter due to diffusion.

An example of an APD, as shown in FIG. 6, is a device comprising a p+-type silicon substrate 601 with doping density of more than $10^{18}$ cm$^{-3}$, on which a photo converter 602 is located, that is made of p-type silicon with doping density of $10^{13}$-$10^{15}$ cm$^{-3}$ by means of epitaxy. The collector layer 608 may be made by means of 0.1-0.5 µm-deep ionic doping of the silicon photo converter 602 using a dopant of the same conduction type with surface concentration of $10^{17}$-$10^{19}$ cm$^{-3}$.

The avalanche amplifier 603 includes two layers: a 5-7 µm-thick multiplier layer 605 made of p-type silicon with doping density of $10^{15}$-$10^{17}$ cm$^{-3}$ by means of epitaxy and a contact layer 604 produced by means of 0.5-1.0 µm-deep diffusion of n-type dopant with density of more than $10^{18}$ cm$^{-3}$. A 5-7 µm-thick buffer layer 615 is made of p-type silicon with doping density of $10^{14}$-$10^{16}$ cm$^{-3}$ by means of epitaxy. Lateral surfaces of the avalanche amplifier 603 are isolated from the collector layer 608 and the photo converter 602 by the insulating gap 612 with parameters like for gap 512 on FIG. 5, which is filled with a dielectric material 613. The material maybe, for example, SiO$_2$, Si$_3$N$_4$, Oxi-Nitride or multi-layer SiO$_2$, Si$_3$N$_4$, Oxi-Nitride, Boron-Silicate, Boron-Phosphorus-Silicate, Phosphorus-Silicate, etc. The dielectric material 613 is located on the surfaces of the collector layer 608, and the contact layer 604, wherein the upper surface of the dielectric layer 613 matches the surface of the first electrode 606. On the upper surfaces of the first electrode 606 and dielectric layer 613, there is a transparent electrode 611 made of ITO, ZnO or layers of Ni, Mo, Ti, Ta or Au, for example, with width less than 20 nm. Two contacts are used to connect the APD to an external circuit: the electrode 607, which is an 0.5-1.0 µm aluminum film, aluminum-silicon or two or more layers Mo, Ni, Ti, Ta, Au, Al films with thickness from 0.05 to 1.0 µm, is placed on the substrate, and another contact to the transparent electrode 606, which is, for example, molybdenum or two or more layers Ni, Mo, Ti, Ta or Au.

Filling the insulating gap 612 with a dielectric material (e.g., SiO$_2$) makes the APD substantially easier to manufacture due to a traditional planar technology and also passivates and stabilizes the silicon surface.

The dielectric cover layer 613 of the photo converter 602 also passivates and protects the semiconductor surface of the photo converter, also providing an antireflection coating, which improves light input into the converter.

A single transparent electrode 611, which is placed across the entire surface of the APD, makes the APD easier to manufacture and makes it possible to implement an APD with a matrix-type structure, in which multiple avalanche amplifiers 603 are dipped into the single photo converter 602 and powered by the single electrode 611.

There is no substantial functional difference between APDs shown in FIG. 5 and FIG. 6, the latter comprising dielectric material 613. Still, this material improves stability of the APD performance due to passivation of open surfaces of semiconductors, of which the photo converter 602, the buffer layer 615 and the avalanche amplifier 603 are made, while also inhibiting surface oscillation of free charge carriers there when there is no signal light.

Also note that if the APD is implemented with more than one avalanche amplifier 603, a dielectric material 613 placed between them would significantly suppress parasitic noise caused by so-called "optical coupling", i.e. photons emitted by a hot charge carrier during avalanche multiplication in one amplifier trigger avalanche multiplication in another amplifier. Since the dielectric material (e.g., SiO$_2$) and the semiconductor (e.g., silicon), of which the amplifier is made, have different refractive indexes, it creates additional reflective borders for optical coupling photons.

The APD shown in FIG. 6 is different from the one shown in FIG. 5 in that the former also comprises a transparent electrode 611 located on its surface, wherein the electrode may be made of any conductive material (e.g., ITO) that has resistance of less than 100 Ohm per square and is transparent for signal light 100. A single transparent electrode 611, which is placed over the entire upper surface of the APD, makes it possible to implement an APD with a matrix-type structure, in which multiple avalanche amplifiers 603 are evenly spaced upon the single photo converter 602 under the electrode 611, wherein each amplifier multiplies photo carriers produced by light in the abutting region of the photo converter.

If the collector layer 608 has high doping density, i.e. more than $10^{17}$ cm$^{-3}$ for the 0.1 µm-thick layer, it will screen the vertical electric field generated by the transparent electrode 611 placed over the photo converter, so that the field cannot pass through inside the converter. In this case, photo carriers are collected from the converter and transported to the avalanche amplifier 603 just as described by FIG. 5 (see above).

If the collector layer 608 has low doping density, i.e. between $10^{16}$-$10^{17}$ cm$^{-3}$, then the vertical electric field generated by the transparent electrode 611 will pass through the collector layer 608 and into the photo converter 609 located under the dielectric layer 610. Photo carriers produced by the light deep in the photo converter are transported by the vertical field and then pressed to the collector layer 608; they are collected in the hidden channel underneath and then drift along it towards the amplifier, driven by a horizontal sweeping field originating from the region of the converter under the amplifier (see FIG. 5).

As shown in FIG. 7, a cross-section of an APD embodiment includes an avalanche amplifier 703 that is located above the upper surface of the photo converter 702, on the buffer layer 715 separating the amplifier from the substrate 701, with a dielectric layer 710 located on the upper surface of the collector layer 708 abutting the lateral surface of the amplifier 703; and also a transparent electrode 711 that is placed on the upper surfaces of the amplifier's contact layer 704 and dielectric layer 710.

An example of an APD, as shown in FIG. 7, is a device comprising a p+-type silicon substrate 701 with doping density of more than $10^{18}$ cm$^{-3}$, on which a photo converter 702 is located that is made of p-type silicon with doping density of $10^{13}$-$10^{15}$ cm$^{-3}$ by means of epitaxy. The collector layer 708 may be made by means of 0.1-1.0 μm-deep ionic doping of the silicon photo converter 702 using a dopant of the same conduction type with surface concentration of $10^{16}$-$10^{19}$ cm$^{-3}$. The avalanche amplifier 703 is located on the buffer layer 715 separating it from the substrate 701. The amplifier 703 includes two layers: a 0.2-5 μm-thick multiplier layer 705 made of p-type silicon with doping density of $10^{15}$-$10^{17}$ cm$^{-3}$ by means of epitaxy and a contact layer 704 produced by means of 0.1-0.5 μm-deep diffusion of n-type dopant with density of more than $10^{18}$ cm$^{-3}$. There is a dielectric layer 710 located on the surface of the collector layer 708, wherein the upper surface of the dielectric layer matches the surface of the first electrode 706. On the upper surfaces of the first electrode 706 and dielectric layer 710, there is a transparent electrode 711, which may be made, e.g., of indium and tin ITO oxides, ZnO oxides or very thin Ni, Mo, Ti, Ta or Au films with a thickness less than 20 nm.

Two contacts are used to connect the APD to an external circuit: the electrode 707, which is typically Al or Al—Si with a width of 0.5-1.0 μm or layers of Mo, Ni, Ti, Ta, Au, Al with a width of 0.05-1.0 μm, and contact to the transparent electrode 711, of Mo or layers of Ni, Mo, Ti, Ta, Au.

The buffer layer 715 is 0.5-1 μm wider than the avalanche amplifier 703, moving the collector layer edge, which is next to the amplifier, away from the intense field region that otherwise could cause spurious oscillation.

When positive voltage is applied to the electrode 706 relative to the electrode 707, it is then applied to the avalanche amplifier 703 and the buffer layer 715 below it, which are serially connected, inducing an electric field there. If the layers are implemented according to the exemplary parameters, then the intensity of this field will be enough to trigger avalanche multiplication of free charge carriers in the multiplier layer 705 and to deplete the buffer layer 715 completely. Meanwhile, the electric field is passing through from the buffer layer 715 to the photo converter 702 located by its side thus creating a depleted region there, while also forming a hidden channel under the collector layer 708 for photoelectrons (see FIG. 2).

Signal light 100 reaching the photo converter 702 is absorbed producing free charge carriers—electrons and holes—there. Photoelectrons produced by the light in the photo converter 702 are collected in the hidden channel and drift along it towards the avalanche amplifier 703. After leaving the hidden channel, photoelectrons get into the buffer layer 715 and further into the avalanche multiplier layer 205 to be multiplied there generating the APD output signal, while holes pass into the substrate 701. Photoelectrons produced by the light outside the depleted region of the photo converter 702 are collected into the depleted region of the photo converter due to diffusion.

There is not much functional difference between APDs shown in FIG. 2 and FIG. 7, the latter comprising a dielectric layer 710. Still, this layer improves stability of the APD performance due to passivation of open surfaces of semiconductors, of which the photo converter 702, the buffer layer 715 and the avalanche amplifier 703 are made, while also inhibiting surface oscillation of free charge carriers there when there is no signal light.

Also note that if the APD is implemented with more than one avalanche amplifier 703, a dielectric layer 710 placed between them would significantly suppress parasitic noise caused by so-called "optical coupling", i.e. photons emitted by a hot charge carrier during avalanche multiplication in one amplifier trigger avalanche multiplication in another amplifier. Since the dielectric material (e.g., $SiO_2$) and the semiconductor (e.g., silicon), of which the amplifier is made, have different refractive indexes, it creates additional reflective borders for optical coupling photons.

A single transparent electrode 711, which is placed over the entire upper surface of the APD, makes it possible to implement an APD with a matrix-type structure, in which multiple avalanche amplifiers 703 are evenly spaced upon the single photo converter 702 under the electrode 711, wherein each amplifier multiplies photo carriers produced by light in the abutting region of the photo converter.

As shown in FIG. 8, an embodiment of APD 803 includes a photo converter 802 and an avalanche amplifier 803, both located next to each other on the same conductive substrate 801, wherein the amplifier includes a contact layer 804 and a multiplier layer 805. On the surface of the contact layer 804, there is a high-resistance material layer 814 designed to provide negative feedback, when an avalanche is being generated, and a multiplication coefficient of $10^5$ or more. Two electrodes are used to connect the APD to an external circuit: the first electrode 806, which is a molybdenum film, is placed on the high-resistance material layer 814 of the avalanche amplifier 803; the second electrode 807, which is an aluminum film, is placed on the substrate 801.

An example of such APD is a device comprising a p+-type silicon substrate 801 with doping density of more than $10^{18}$ cm$^{-3}$, a photo converter 802 made of p-type silicon with doping density of $10^{13}$-$10^{15}$ cm$^{-3}$ by means of epitaxy, and an avalanche amplifier 803 which includes two layers: a 0.2-0.5 μm-thick multiplier layer 805 made of p-type silicon with doping density of $10^{15}$-$10^{17}$ cm$^{-3}$ by means of epitaxy and a contact layer 804 produced by means of 0.5-1.0 μm-deep diffusion of n-type dopant with density of more than $10^{18}$ cm$^{-3}$. On the surface of the contact layer 804, there is a high-resistance material layer 814 made of SiOC, SiC or polysilicon with a resistivity higher than 1500 Ohm-cm. Two electrodes are used to connect the APD to an external circuit: the first electrode 806, which is a molybdenum film, is placed on the high-resistance material layer 813 of the avalanche amplifier 803; the second electrode 807, which is an aluminum film, is placed on the substrate 801.

The main functional difference between APDs shown on FIG. 1 and FIG. 8 is that the latter is able to operate in so-called "Geiger mode" due to the high-resistance layer 814, which may be important for certain implementations.

Having thus described the different embodiments of the invention, it should be apparent to those skilled in the art that certain advantages of the described method and apparatus have been achieved. It should also be appreciated that various modifications, adaptations, and alternative embodiments thereof may be made within the scope and spirit of the present invention. The invention is further defined by the following claims.

What is claimed is:
1. An avalanche photodetector (APD) comprising:
   a photo converter layer for signals to be converted into a current of free charge carriers; and
   at least one avalanche amplifier for the current, wherein the photo converter layer and the avalanche amplifier are located next to each other on the same substrate and are in direct contact with each other, wherein the avalanche amplifier includes a contact layer and a multiplier layer, wherein the multiplier layer is made of a semiconductor of the same conductivity type as the photo converter layer and faces the substrate while abutting the photo converter layer on one side, and wherein a first electrode is on the contact layer of the avalanche amplifier, and the second electrode is on a bottom of the substrate.

2. The APD of claim 1, wherein the multiplier layer of the avalanche amplifier is made of the same semiconductor as the photo converter layer.

3. The APD of claim 1, further comprising a collector layer on an upper surface of the photo converter layer, and a gap between the collector layer and the avalanche amplifier.

4. The APD of claim 1, wherein the surface of the contact layer of the avalanche amplifier facing an electrode is a continuation of the upper surfaces of the photo converter layer.

5. The APD of claim 1, wherein an upper surface of the contact layer of the avalanche amplifier is above upper surfaces of the photo converter layer.

6. The APD of claim 1, wherein the avalanche amplifier is a P/N junction formed by the multiplier layer and the contact layer.

7. The APD of claim 6, further comprising a collector layer on an upper surface of the photo converter layer, and a gap between the collector layer and the avalanche amplifier.

8. The APD of claim 6, wherein an upper surface of the contact layer of the avalanche amplifier is above upper surfaces of the photo converter layer.

9. The APD of claim 6, wherein the avalanche amplifier is made of the same semiconductor as the photo converter layer.

10. The APD of claim 9, wherein the surface of the contact layer of the avalanche amplifier facing an electrode is a continuation of the upper surfaces of the photo converter layer.

11. The APD of claim 10, further comprising an additional high-resistance material layer between the contact layer of the avalanche amplifier and the first electrode.

12. The APD of claim 11, wherein first electrodes of the avalanche amplifiers are electrically connected to each other.

13. The APD of claim 12, wherein an upper surface of the contact layer of the avalanche amplifier is above upper surfaces of the photo converter layer.

14. The APD of claim 13, further comprising an additional dielectric layer on upper surfaces of the photo converter layer and abutting a lateral surface of the avalanche amplifier.

15. The APD of claim 14, wherein the first electrode is transparent and is placed on upper surfaces of the contact layer of the avalanche amplifier and the dielectric layer.

16. The APD of claim 15, further comprising an additional high-resistance material layer between the contact layer of the avalanche amplifier and the first electrode.

17. The APD of claim 16, wherein first electrodes of the avalanche amplifiers are electrically connected to each other.

18. The APD of claim 9, further comprising a collector layer on an upper surface of the photo converter layer, and a gap between the collector layer and the avalanche amplifier.

19. The APD of claim 18, wherein the collector layer is made of a semiconductor of the same conductivity type as the photo converter layer.

20. The APD of claim 19, wherein a doping level of the collector layer is higher than a doping level of the photo converter layer.

21. The APD of claim 20, wherein the collector layer is made of the same semiconductor as the photo converter layer.

22. The APD of claim 21, wherein the surface of the contact layer of the avalanche amplifier facing an electrode is a continuation of the upper surfaces of the collector layer and photo converter layer.

23. The APD of claim 22, further comprising an additional high-resistance material layer between the contact layer of the avalanche amplifier and the first electrode.

24. The APD of claim 23, wherein first electrodes of the avalanche amplifiers are electrically connected to each other.

25. The APD of claim 21, wherein an upper surface of the contact layer of the avalanche amplifier is above upper surfaces of the photo converter layer and collector layer.

26. The APD of claim 25, further comprising an additional dielectric layer on upper surfaces of the photo converter layer and the collector layer, and abutting a lateral surface of the avalanche amplifier.

27. The APD of claim 26, wherein the first electrode is transparent and is placed on upper surfaces of the contact layer of the avalanche amplifier and the dielectric layer.

28. The APD of claim 27, further comprising an additional high-resistance material layer between the contact layer of the avalanche amplifier and the first electrode.

29. The APD of claim 28, wherein first electrodes of the avalanche amplifiers are electrically connected to each other.

30. An avalanche photodetector (APD) comprising:
a photo converter layer for signals to be converted into a current of free charge carriers; and
at least one avalanche amplifier for the current,
wherein the photo converter layer and the avalanche amplifier are located next to each other on the same substrate,
wherein the avalanche amplifier includes a contact layer and a multiplier layer; and
a buffer layer between the substrate and the multiplier layer;
wherein the buffer layer abuts the photo converter layer,
wherein the buffer layer is made of a semiconductor of the same conductivity type as the photo converter layer, and
wherein a first electrode is on the contact layer of the avalanche amplifier, and a second electrode is on a bottom of the substrate.

31. The APD of claim 30, wherein the multiplier layer of the avalanche amplifier is made of the same semiconductor as the photo converter layer.

32. The APD of claim 30, further comprising a collector layer on an upper surface of the photo converter layer, and a gap between the collector layer and the avalanche amplifier.

33. The APD of claim 30, wherein the avalanche amplifier is below upper surfaces of the photo converter layer and does not form an electric connection between the photo converter layer, the contact layer and the first electrode of the avalanche amplifier.

34. The APD of claim 30, wherein an upper surface of the contact layer of the avalanche amplifier is above upper surfaces of the photo converter layer.

35. The APD of claim 30, wherein the avalanche amplifier is a P/N junction formed by the multiplier layer and the contact layer.

36. The APD of claim 35, further comprising a collector layer on an upper surface of the photo converter layer, and a gap between the collector layer and the avalanche amplifier.

37. The APD of claim 35, wherein the avalanche amplifier is below upper surfaces of the photo converter layer and does not form an electric connection between the photo converter layer, the contact layer and the first electrode of the avalanche amplifier.

38. The APD of claim 35, wherein an upper surface of the contact layer of the avalanche amplifier is above upper surfaces of the photo converter layer.

39. The APD of claim 35, wherein the avalanche amplifier and the buffer layer are made of the same semiconductor as the photo converter layer.

40. The APD of claim 39, wherein the avalanche amplifier is below upper surfaces of the photo converter layer and does not form an electric connection between the photo converter layer, the contact layer and the first electrode of the avalanche amplifier.

41. The APD of claim 40, further comprising a collector layer on an upper surface of the photo converter layer, and a gap between the collector layer and the avalanche amplifier.

42. The APD of claim 41, wherein the collector layer is made of a semiconductor of the same conductivity type as the photo converter layer.

43. The APD of claim 42, wherein a doping level of the collector layer is higher than a doping level of the photo converter layer.

44. The APD of claim 43, wherein the collector layer is made of the same semiconductor as the photo converter layer.

45. The APD of claim 44, further comprising a dielectric material layer between the avalanche amplifier and the collector layer.

46. The APD of claim 45, wherein the dielectric material layer covers surfaces of the photo converter layer and collector layer.

47. The APD of claim 46, further comprising an additional transparent electrode on upper surfaces of the first electrode and the dielectric material layer.

48. The APD of claim 47, further comprising an additional high-resistance material layer between the contact layer of the avalanche amplifier and the first electrode.

49. The APD of claim 48, wherein first electrodes of the avalanche amplifiers are electrically connected to each other.

50. The APD of claim 40, further comprising a dielectric material layer between the avalanche amplifier and the photo converter layer.

51. The APD of claim 50, wherein the dielectric material layer covers surfaces of the photo converter layer.

52. The APD of claim 51, further comprising an additional transparent electrode on upper surfaces of the first electrode and the dielectric material layer.

53. The APD of claim 52, further comprising an additional high-resistance material layer between the contact layer of the avalanche amplifier and the first electrode.

54. The APD of claim 53, wherein first electrodes of the avalanche amplifiers are electrically connected to each other.

55. The APD of claim 39, wherein the buffer layer has the same thickness as the photo converter layer.

56. The APD of claim 55, wherein an upper surface of the contact layer of the avalanche amplifier is above upper surfaces of the photo converter layer.

57. The APD of claim 56, further comprising an additional dielectric layer on upper surfaces of the photo converter layer and abutting a lateral surface of the avalanche amplifier.

58. The APD of claim 57, wherein the first electrode is transparent and is placed on upper surfaces of the contact layer of the avalanche amplifier and the dielectric layer.

59. The APD of claim 58, further comprising an additional high-resistance material layer between the contact layer of the avalanche amplifier and the first electrode.

60. The APD of claim 59, wherein first electrodes of the avalanche amplifiers are electrically connected to each other.

61. The APD of claim 55, further comprising a collector layer on an upper surface of the photo converter layer, and a gap between the collector layer and the avalanche amplifier.

62. The APD of claim 61, wherein the collector layer is made of a semiconductor of the same conductivity type as the photo converter layer.

63. The APD of claim 62, wherein a doping level of the collector layer is higher than a doping level of the photo converter layer.

64. The APD of claim 63, wherein the collector layer is made of the same semiconductor as the photo converter layer.

65. The APD of claim 64, wherein an upper surface of the contact layer of the avalanche amplifier is above upper surfaces of the photo converter layer and collector layer.

66. The APD of claim 65, further comprising an additional dielectric layer on upper surfaces of the photo converter layer and the collector layer, and abutting a lateral surface of the avalanche amplifier.

67. The APD of claim 66, wherein the first electrode is transparent and is placed on upper surfaces of the contact layer of the avalanche amplifier and the dielectric layer.

68. The APD of claim 67, further comprising an additional high-resistance material layer between the contact layer of the avalanche amplifier and the first electrode.

69. The APD of claim 68, wherein first electrodes of the avalanche amplifiers are electrically connected to each other.

* * * * *